(12) United States Patent
Morita et al.

(10) Patent No.: US 7,829,436 B2
(45) Date of Patent: Nov. 9, 2010

(54) PROCESS FOR REGENERATION OF A LAYER TRANSFERRED WAFER AND REGENERATED LAYER TRANSFERRED WAFER

(75) Inventors: Etsurou Morita, Tokyo (JP); Shinji Okawa, Tokyo (JP); Isoroku Ono, Tokyo (JP)

(73) Assignee: SUMCO Corporation, Tokyo (JP)

( * ) Notice: Subject to any disclaimer, the term of this patent is extended or adjusted under 35 U.S.C. 154(b) by 992 days.

(21) Appl. No.: 11/614,745

(22) Filed: Dec. 21, 2006

(65) Prior Publication Data

US 2007/0148914 A1 Jun. 28, 2007

Related U.S. Application Data

(60) Provisional application No. 60/753,088, filed on Dec. 22, 2005.

(51) Int. Cl.
H01L 21/46 (2006.01)
(52) U.S. Cl. ........................ 438/459; 438/458; 438/457; 438/E21.23
(58) Field of Classification Search .......... 438/455–459
See application file for complete search history.

(56) References Cited

U.S. PATENT DOCUMENTS

| 7,582,540 B2 * | 9/2009 | Shiota et al. ................. 438/459 |
| 2008/0124929 A1 * | 5/2008 | Okuda et al. ................. 438/692 |

FOREIGN PATENT DOCUMENTS

JP 2001-155978 6/2001
WO 02/084721 10/2002

OTHER PUBLICATIONS

English Language Abstract of JP 2001-155978.
U.S. Appl. No. 11/614,792, filed Dec. 21, 2006, and entitled "Process for Regeneration of a Layer Transferred Wafer and Regenerated Layer Transferred Wafer".
U.S. Appl. No. 11/614,681, filed Dec. 21, 2006, and entitled "Method for Manufacturing Direct Bonded SOI Wafer and Direct Bonded SOI Wafer Manufactured by the Method.".

* cited by examiner

*Primary Examiner*—DUng A. Le
(74) *Attorney, Agent, or Firm*—Greenblum & Bernstein, P.L.C.

(57) ABSTRACT

A processing time required for regeneration of a layer transferred wafer is reduced and the regeneration cost is lowered, while a removal amount at the regeneration is decreased the number of regeneration times is increased. A main surface of a semiconductor wafer (13) has a main flat portion (13d) and a chamfered portion (13c) formed in the periphery of the main flat portion (13d), an ion implanted area (13b) is formed by implanting ions only into the main flat portion (13d), a laminated body (16) is formed by laminating the main flat portion (13d) on a main surface of a support wafer (14), and moreover, the semiconductor wafer (13) is separated from a thin layer (17) in the ion implanted area (13b) by heat treatment at a predetermined temperature so as to obtain a thick layer transferred wafer (12), which is to be regenerated. The main flat portion (13d) of the semiconductor wafer (13) is formed to have a ring-shape step (13e) protruding from the chamfered portion (13c), and the semiconductor wafer (13) is separated from the thin layer (17) on the whole surface of the ion implanted area (13b) so that no step is generated in the periphery thereby to obtain the layer transferred wafer (12).

15 Claims, 3 Drawing Sheets

PROCESS FOR REGENERATION OF A LAYER TRANSFERRED WAFER AND REGENERATED LAYER TRANSFERRED WAFER

CROSS REFERENCE TO RELATED APPLICATIONS

This application is based upon and claims priority from U.S. Provisional Application No. 60/753,088, filed Dec. 22, 2005.

BACKGROUND OF THE INVENTION

1. Field of the Invention

The present invention relates to a process for regeneration of a thick layer transferred wafer obtained by forming a laminated body by laminating a semiconductor wafer onto which implanted into a support wafer and by separating from a thin layer of the semiconductor wafer in the ion implanted area by heat treatment of this laminated body and a layer transferred wafer regenerated by this process. The present invention relates more particularly to a process for regeneration of a layer transferred wafer regenerated in the so-called ion implantation separation method for producing bonded wafers such as SOI (Silicon On Insulator) and a regenerated wafer.

2. Description of the Related Art

As a conventional process for manufacturing an SOI wafer, a process is known in which an ion is implanted on a main surface of a semiconductor wafer to form an ion implanted area inside the semiconductor wafer, a main surface of the semiconductor wafer is laminated on a main surface of a support wafer to form a laminated body, the laminated body is subjected to heat treatment at a predetermined temperature and the ion-implanted wafer is separated after bonding so as to manufacture the SOI wafer. The semiconductor wafer and the support wafer used in this method have the same diameter and the same thickness are used, and this is a technology to obtain an SOI wafer in which the semiconductor wafer is separated to be a thin film with the ion implanted area implanted on the main surface of the semiconductor wafer as a cleaved surface and the support wafer is thermally treated with the thin film to reinforce bonding. With this method, the cleaved surface is a favorable mirror surface, and an SOI wafer whose the film thickness has high uniformity is obtained relatively easily.

On the other hand, when a bond wafer such as the SOI wafer is made with this ion-implanting layer transferring method, a single layer transferred wafer is inevitably sub-generated. In this ion-implanting layer transferring method, by regenerating this sub-generated layer transferred wafer, a plurality of SOI wafers can be obtained using a substantially single semiconductor wafer, which can considerably reduce the cost.

However, a wafer is usually chamfered, and even if the wafers with the same outer diameter are laminated together, all the peripheries are not in contact. And when the semiconductor wafer is separated to be a thin film with the ion implanted area as the cleaved surface, its periphery remains not separated, and there is a problem that a step is generated in the periphery of the regenerated layer transferred wafer. Also, a damage layer due to ion-implanting exists on the separated surface of the layer transferred wafer and the surface roughness can be large, which makes it difficult to use the layer transferred wafer as it is. Therefore, it is necessary to remove the steps and damage layer and to reduce surface roughness for regeneration of this layer transferred wafer, and it is also necessary to prevent generation of particles caused by an ion implanted layer remaining on the step.

As a conventional process for regeneration of a layer transferred wafer, a process for regeneration of a layer transferred wafer is known in which after an ion implanted layer remaining on the step in the periphery of the separated surface of the layer transferred wafer is removed by chamfering or etching, a main surface of the wafer on the layer-transferred side is polished (See the patent document 1, for example). According to this process for regeneration, since the removal of the ion implanted layer is performed by chamfering or the like, after that, the so-called mirror polishing (mirror chamfering) is performed on the face which has become rough due to the chamfering or the like. By this process for regeneration of a layer transferred wafer, the generation of particles caused by existence of the ion implanted layer is prevented by removing the ion implanted layer, the damage layer on the surface of the layer transferred wafer is removed, and the surface roughness of the layer transferred wafer can be improved.

[Patent Document 1] Japanese unexamined Patent Application No. 2001-155978 (claim 1, Paragraphs 0032 and 0052).

However, by the conventional process for regeneration of a layer transferred wafer shown in the patent document 1, since the ion implanted layer is removed by chamfering or etching and then subjected to mirror polishing, the surface roughness of the layer transferred wafer can be reduced, but the problem is that more time is required to regenerate the layer transferred wafer and the number of times capable of regeneration is decreased since a removal amount of a wafer to be processed is relatively increased due to grinding.

An object of the present invention is to provide a process for regeneration of a layer transferred wafer which can reduce the regeneration cost by reducing a processing time required for the regeneration of the layer transferred wafer and increase the number of regeneration times by decreasing a removal amount at the regeneration and a regenerated wafer.

SUMMARY OF THE INVENTION

The invention according to claim 1 is, as shown in FIG. 1, with respect to a main surface of a semiconductor wafer having a main flat portion and a chamfered portion formed in the periphery of the main flat portion, a process for regeneration of a thick layer transferred wafer obtained by forming an ion implanted area within the semiconductor wafer by implanting ions only into the main flat portion of the semiconductor wafer, forming a laminated body by laminating the main flat portion of the semiconductor wafer on a main surface of a support wafer, and by separating the semiconductor wafer in the ion implanted area from a thin layer by heat treatment of the laminated body at a predetermined temperature.

It is characterized in that the main flat portion of the semiconductor wafer is formed protruding from the chamfered portion and having a ring-shape step, and the layer transferred wafer is obtained by separating the semiconductor wafer from the thin layer on the whole surface of the ion implanted area so that no step is generated in the periphery.

According to the process for regeneration of a layer transferred wafer described in claim 1, the semiconductor wafer is separated from the thin layer on the whole surface of the ion implanted area, and no step is generated in the periphery of the separated surface of the layer transferred wafer. Therefore, the conventional chamfering or etching which has been carried out in order to remove an ion implanted layer remaining on this step can be omitted. Thus, according to the invention in claim 1, a processing time required for the regeneration of a layer transferred wafer is reduced than before, the regeneration cost is reduced and the number of regeneration times can be increased since a removal amount at regeneration is decreased.

Also, since the semiconductor wafer is formed so that the main flat portion protrudes from the chamfered portion and has the ring-shape step, an outer diameter $D_1$ of the main flat portion becomes smaller than an outer diameter $D_2$ of the support wafer, and the whole of the main flat portion is in contact with the support wafer, the semiconductor wafer can be separated from the thin layer on the whole surface of the ion implanted area relatively easily.

The invention according to claim 2 is, in the invention according to claim 1, wherein, as shown in FIG. 2, the semiconductor wafer further has a ring-shape flat portion between the main flat portion and the chamfered portion, and a width w of the ring-shape flat portion is 0.1 to 2 mm.

By the process for regeneration of a layer transferred wafer described in claim 2, the main flat portion with a diameter smaller than the outer diameter $D_2$ of the support wafer can be formed easily by forming the ring-shape flat portion, and by setting the width w of the ring-shape flat portion to 0.1 to 2 mm, the whole laminated surface of the semiconductor wafer can be brought into contact with the support wafer. Here, if the width w of the ring-shape flat portion is less than 0.1 mm, there is a problem that a step is generated in the periphery of the layer transferred wafer, while if the width w exceeds 2 mm, there is a problem that an area where an SOI device can be created becomes narrow.

The invention according to claim 3 is related to claim 2, as shown in an enlarged view of FIG. 2, wherein a bias amount s by which a center p on the end face connecting both chamfered portions formed respectively on both main surfaces of the semiconductor wafer to each other is biased from a center c in the thickness direction of the semiconductor wafer is not more than 50 μm.

By the process for regeneration of a layer transferred wafer described in claim 3, biasing the center p with respect to the center c further facilitates formation of the main flat portion. Here, if the bias amount 8 exceeds 50 μm, it is difficult to handle the layer transferred wafer 12 in the subsequent polishing or the like.

The invention according to claim 4 is related to any one of claims 1 to 3, wherein the ring-shape step is 5 to 100 μm.

By the process for regeneration of a layer transferred wafer described in claim 4, setting the ring-shape step to 5 to 100 μm enables formation of the ion implanted area by implanting ions only into the main flat portion. Here, if the ring-shape step is less than 5 μm, there is a problem that the number of regeneration times is decreased. If, on the other hand, the ring-shape step exceeds 100 μm, the step begins to go slack and it becomes difficult to laminate the whole main flat portion on the main surface of the support wafer. It is more preferable that the ring-shape step is 10 to 50 μm.

The invention according to claim 5 is related to any one of claims 1 to 4, wherein, as further shown in FIG. 3, a process to obtain a regenerated wafer by polishing the separated surface of the layer transferred wafer is further included, and the removal amount in the separated surface of the layer transferred wafer at polishing is not less than 0.2 μm but not more than 1 μm.

By the process for regeneration of a layer transferred wafer described in claim 5, by setting the removal amount at polishing shown in FIG. 3(c) to not more than 1 μm, a processing time required for regeneration of the layer transferred wafer is reduced to lower the regeneration cost and the number of regeneration times can be sufficiently increased. Here, if the removal amount exceeds 1 μm, there is a problem that flatness on the polished surface might be deteriorated, while if the removal amount is less than 0.2 μm, there is a problem that the damage area on the separated surface can not be removed.

The invention according to claim 6 is related to claim 5, wherein a regenerated wafer obtained by polishing the separated surface of the layer transferred wafer is subjected to heat treatment at 900 to 1100° C. in the oxidized atmosphere.

By the process for regeneration of a layer transferred wafer described in claim 6, damage in the chamfered portion generated at the implantation of ion can be alleviated by heat treatment of the regenerated wafer 32.

The invention according to claim 7 is related to any one of claims 1 to 6, wherein the regenerated wafer is used for the semiconductor wafer.

By the process for regeneration of a layer transferred wafer described in claim 7, making the initial semiconductor wafer relatively thick, the regenerated wafer can be reused two times or more, which can further reduce the manufacturing cost of the SOI wafer.

The invention according to claim 8 is a regenerated wafer by the process of any one of claims 1 to 7.

In the regenerated wafer described in claim 8, since the separated surface of the layer transferred wafer is polished in which the semiconductor wafer is separated from the thin layer on the whole surface of the ion implanted area so that no step is generated in the periphery, it has a high flatness.

DETAILED DESCRIPTION OF THE PREFERRED EMBODIMENT

Next, the preferred embodiment of the present invention will be described based on the drawings.

Figure 1:
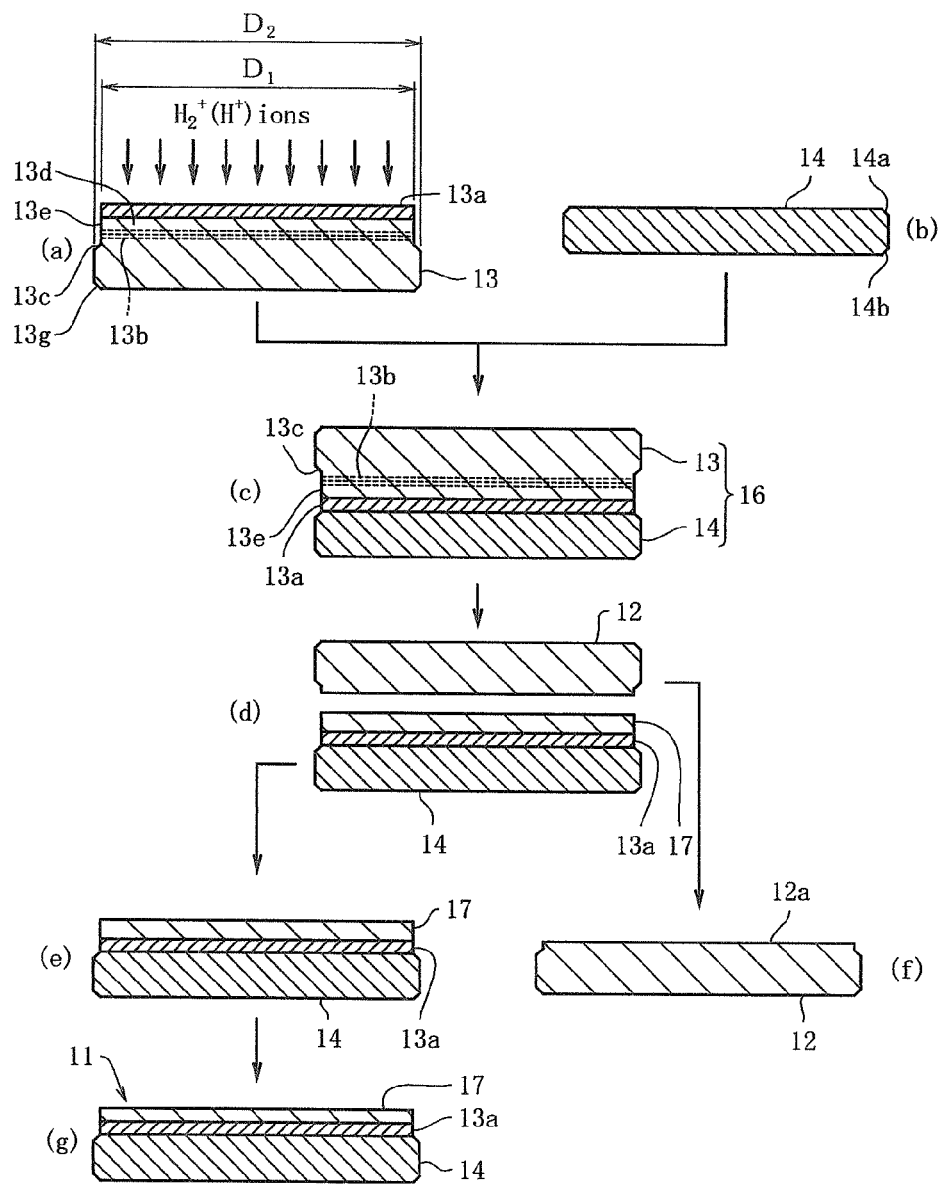
FIG. 1 is a diagram showing a producing process of an SOI wafer including a layer transferred wafer of the preferred embodiment of the present invention in the order of the processes.

As shown in FIG. 1, a layer transferred wafer 12 is generated secondarily when producing SOI wafer 11. In order to produce the SOI wafer 11, as shown in FIG. 1(a), a semiconductor wafer 13 as a bond wafer and a support wafer 14 as a base wafer are prepared. In this preferred embodiment, these wafers 13 and 14 are produced by the Czochralski method, respectively, and they have the same diameter and the same thickness, and chamfered portions 13c, 13g, 14a and 14b are formed respectively in the periphery of both the main surfaces. These wafers 13, 14 are subjected to the RCA cleaning after polishing both the surfaces.

However, a main flat portion 13d is formed on one of the main surfaces of the semiconductor wafer 13, and the main flat portion 13d is formed so that it has a ring-shape step 13e on the periphery protruding from the chamfered portion 13c formed on the periphery. In order to produce the semiconductor wafer 13 in which the main flat portion 13d protrudes from the chamfered portion 13c, the ring-shape step 13e is formed at the same time when the periphery of a wafer obtained by slicing an ingot is chamfered to form the chamfered portions 13c, 13g. Here, a chamfering device 20 for forming the chamfered portion 13c on the periphery of the wafer is shown in FIG. 2.

Figure 2:
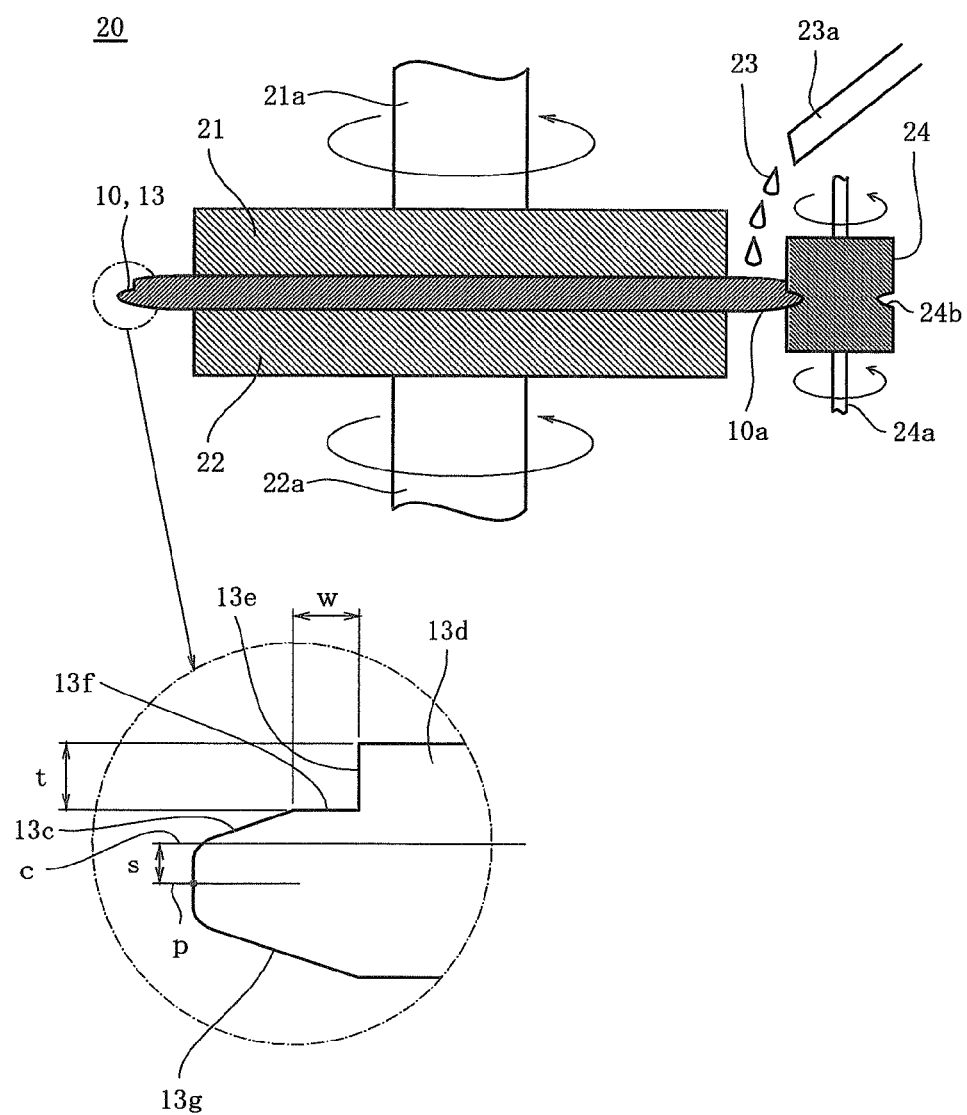
FIG. 2 is a sectional block diagram showing a device for grinding the periphery of a wafer.

The chamfering device shown in FIG. 2 comprises an upper and a lower chucks 21, 22 for vertically holding a wafer 10 obtained by slicing an ingot and horizontally rotating the wafer 10, a piping 23a for supplying a polishing liquid 23 and a polishing roller 24 for forming the chamfered portions 13c, 13g by grinding the periphery of the wafer. The upper and the lower chucks 21, 22 are provided with pivots 21a, 22a, respectively, and connected to a rotary motor, not shown. The upper and the lower chucks 21, 22 are constituted with a diameter smaller than the wafer diameter and have such a size that the periphery of the wafer 10 is exposed by vertically holding the wafer 10 between them. The polishing roller 24 is made of a grinding wheel and formed in the shape of a drum. The polishing roller 24 is provided with a pivot 24a, rotated by the rotary motor, not shown, and arranged so that the surface of the polishing roller 24 is opposed to the periphery of the wafer 13. Then, a recessed groove 24b is formed in the periphery of the polishing roller 24 so as to form the chamfered portions 13c, 13g and the ring-shape step 13e by grinding the periphery of the wafer 13. The piping 23a is provided at a position to supply the polishing liquid 23 onto the wafer chamfered surface.

In order to form the chamfered portion 13c and the ring-shape step 13e on the periphery of the wafer 10 by this chamfering device 20, the wafer 10 is held vertically by the upper and the lower chucks 21, 22 between them and horizontally rotated by the rotary motor, not shown. And the polishing roller 24 is rotated and brought into contact with the periphery of the wafer 10 while dripping the polishing liquid 23 from the piping 23a, the periphery is ground by the polishing roller 24 and the chamfered portion 13c and the ring-shape step 13e are formed. After that, this wafer 10 goes through the processes of machine polishing (lapping), etching, PCR, mirror polishing (polishing) and cleaning so as to produce the semiconductor wafer 13 in which the main flat portion 13d has the ring-shape step 13e protruding from the chamfered portion 13c.

Here, in this preferred embodiment, as shown in the enlarged view in FIG. 2, there is an example shown that the ring-shape flat portion 13f is formed between the main flat portion 13d and the chamfered portion 13c in the semiconductor wafer 13, and the width w of the ring-shape flat portion 13f is within the range of 0.1 to 2 mm. Also, both the chamfered portions 13c are formed so that a bias amount s by which a center p on the end face connecting both chamfered portions 13c, 13g formed respectively on both main surfaces of the semiconductor wafer 13 to each other is biased from a center c in the thickness direction of the semiconductor wafer 13 is not more than 50 μm. And the thickness t of the ring-shape step 13e, that is, the main flat portion 13d is formed in the range of 5 to 100 μm.

Returning to FIG. 1(a), in the semiconductor wafer 13 manufactured as above, first, an oxide film 13a ($SiO_2$ film), which is an insulating film, is formed on the main flat portion 13d, which is a laminated surface of the wafer 13, by thermal oxidization, and then, hydrogen ions ($H^+$), which are hydrogen gas ions, are implanted in a dose amount of $3.0\times10^{16}/cm^2$ or more or a hydrogen-molecule ions ($H^{2+}$) in a dose amount of $1.5\times10^{16}/cm^2$ or more into the main flat portion 13d of the wafer 13 (FIG. 1(a)). Here, the reference numeral 13b in FIG. 1(a) is an ion implanted area formed inside the main flat portion 13d by the implantation of the hydrogen gas ions or the hydrogen-molecule ions, and this ion implanted area 13b is formed in parallel with the oxide film 13a, that is, the surface of the semiconductor wafer 13. In the case of the hydrogen gas ions ($H^+$), about twice the implanting amount of the hydrogen-molecule ions ($H^{2+}$) are required. Instead of implanting the hydrogen gas ions and the hydrogen-molecule ions, a helium ion ($He^+$) may be implanted with the implantation of the hydrogen gas ions or the hydrogen-molecule ions. In this case, a dose amount of helium ion is preferably $0.5\times10^{16}/cm^2$ or more.

Next, the main flat portion 13d of the semiconductor wafer 13 is laminated onto the main surface of the support wafer 14 shown in FIG. 1(b) through the oxide film 13a at a room temperature so as to form a laminated body 16 (FIG. 1(c)). The temperature of this laminated body 16 is raised to the range of 500 to 800° C. in an atmosphere of nitrogen ($N_2$) and kept in this temperature range for 5 to 30 minutes and then, thin-layer separation heat-treatment is carried out. This causes the semiconductor wafer 13 to split in the ion implanted area 13b and separate into an upper thick layer transferred wafer 12 and a lower thin layer 17 (FIG. 1(d)). Here, the present invention is characterized in that the layer transferred wafer 12 is obtained by separating the semiconductor wafer 13 from the thin layer 17 on the whole surface of the ion implanted area 13b so that no step is generated in the periphery.

Next, the temperature of the laminated body 16 in which the above semiconductor wafer 13 is split in the ion implanted area 13b is lowered, and the layer transferred wafer 12 is removed from the support wafer 14 onto which the thin layer 17 is laminated through the oxide film 13a (hereinafter referred to simply as the support wafer 14). Heat treatment is carried out that the temperature of the above support wafer 14 is raised to the range of 900 to 1200° C. in an atmosphere of oxygen ($O_2$) or nitrogen ($N_2$) and kept in this temperature range for 30 to 120 minutes (FIG. 1E). This heat treatment is heat treatment to reinforce bonding of the thin layer 17 onto the support wafer 14. Moreover, the separated surface of the support wafer 14 is subjected to the annealing treatment and polishing (touch polishing) to smoothen (FIG. 1(g)). By this, the support wafer 14 is made into the SOI wafer 11.

Figure 3:
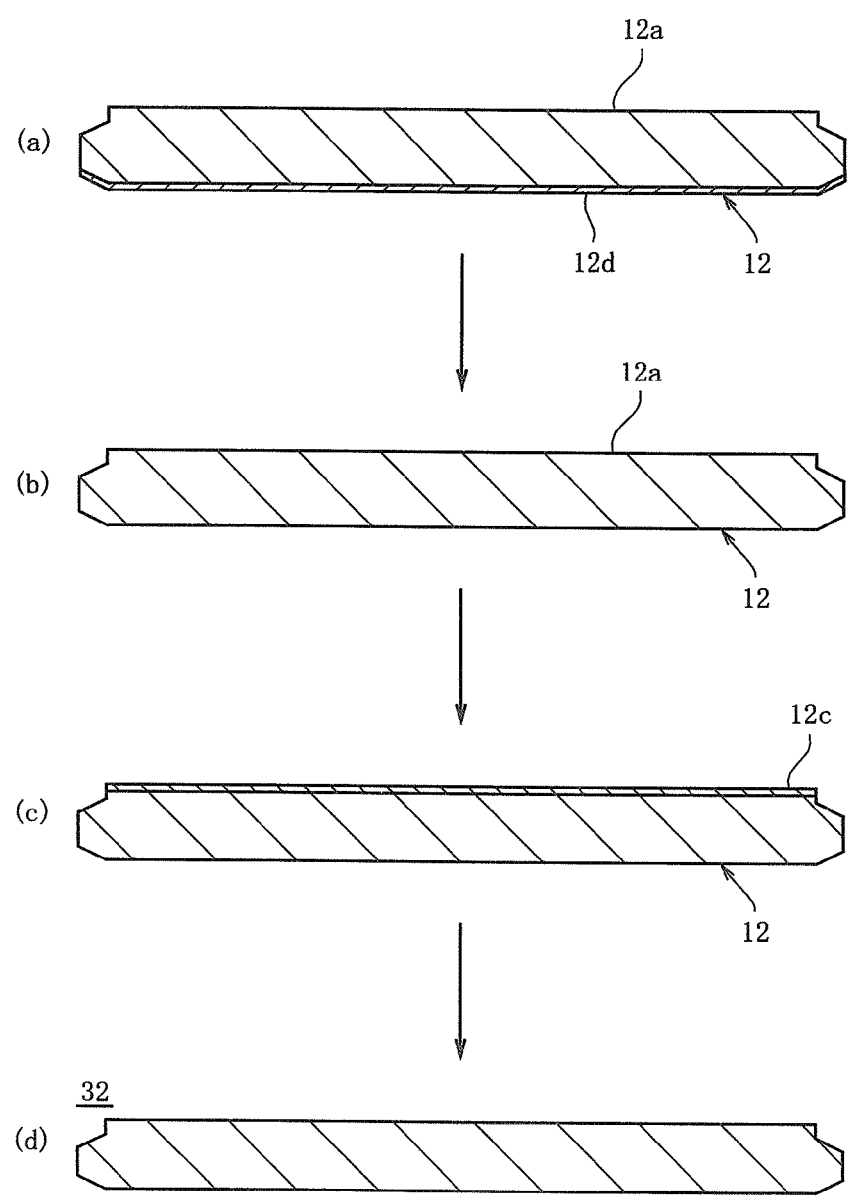
FIG. 3 is a diagram showing processes to obtain a regenerated wafer by polishing a separated surface of the layer transferred wafer in the order of the processes.

On the other hand, since the semiconductor wafer 13 is separated from the thin layer 17 on the whole surface of the ion implanted area 13b, no step is generated in the periphery of the layer transferred wafer 12. And the layer transferred wafer 12 is regenerated by polishing the separated surface 12a. As shown in FIG. 3(a), if an oxide film 12d formed by heat treatment or the like remains on a second main surface on the side opposite to the separated surface 12a of the layer transferred wafer 12, it is preferable to remove the oxide film 12d by dipping this layer transferred wafer 12 in fluorinated acid or the like, as shown in FIG. 3(b), before polishing the layer transferred wafer 12.

Next, this layer transferred wafer 12 is polished. The polishing is carried out with a general polishing device, not shown. More specifically, the layer transferred wafer 12 is loaded and fixed on a holding table of the polishing device, not shown, and the polishing liquid is supplied from a polishing liquid supplying means and a polishing cloth is impregnated with this polishing liquid. In this state, the holding table is rotated together with the layer transferred wafer 12, a polishing cloth holder is rotated together with the polishing cloth, and then the polishing cloth is brought into pressure contact with the separated surface 12a of the layer transferred wafer 12 by a pressure contact/rotating means so as to polish the layer transferred wafer 12. At this time, though grinding using a grinding wheel has been conventionally performed at the generation of a step, such grinding is not carried out. As a result thereof, there is no damage accompanying grinding but the removal amount 12c at polishing in the separated surface 12a of the layer transferred wafer 12 shown in FIG. 3(c) can be made into not more than 1 μm. After final polishing of the surface of the layer transferred wafer 12, final cleaning is performed. In the final polishing, a suede final polishing cloth in which urethane resin is foamed on a non-woven base cloth and a final polishing liquid added with abrasive grains as well as an organic high molecule as a haze inhibitor is used. In this way, the layer transferred wafer 12 is regenerated and the regenerated wafer 32 shown in FIG. 3(d) is obtained.

In this way, by the process for regeneration of a layer transferred wafer of the present invention, since the ion implanted area 13b is formed inside the semiconductor wafer 13 by the ion implantation only into the main flat portion 13d protruding from the chamfered portion and then the layer transferred wafer 12 is obtained in which no step is generated in the periphery by separating the semiconductor wafer 13 from the thin layer 17 on the whole surface of the ion implanted area 13b, chamfering or etching can be omitted which has been carried out in order to remove the ion implanted layer remaining on a step generated around the separated surface of the layer transferred wafer 12. Therefore, the regenerated wafer 32 can be obtained by relatively simple work of only polishing the separated surface 12a of the layer transferred wafer 12, and the obtained regenerated wafer 32 has no damage and extremely small removal amount 12d at polishing, and the semiconductor wafer 13 or the support wafer 14 can be reused more times and the manufacturing cost of the SOI wafer 11 can be reduced.

As mentioned above, according to the present invention, since the ion implanted area is formed inside the semiconductor wafer by implanting ions only into the main flat portion protruding from the chamfered portion and the layer transferred wafer in which no step is generated in the periphery is obtained by separating the semiconductor wafer from the thin layer on the whole surface of the ion implanted area, chamfering or etching can be omitted which has been carried out in order to remove the ion implanted layer remaining on a step generated around the separated surface of the layer transferred wafer. Therefore, a processing time required for regeneration of the layer transferred wafer is extremely reduced than before by immediately polishing the separated surface of the layer transferred wafer to obtain the regenerated wafer, the regeneration cost is reduced, the removal amount at regeneration is decreased and the number of regeneration times can be increased.

Also, when the ring-shape flat portion is formed between the main flat portion and the chamfered portion, the formation of the main flat portion is facilitated if the width of the ring-shape flat portion is 0.1 to 2 mm, and if the bias amount is set to not more than 50 μm by which the center on the end face connecting both the chamfered portions formed respectively on both the main surfaces of the semiconductor wafer to each other is biased from a center in the thickness direction of the semiconductor wafer, the formation of the main flat portion is further facilitated. In the meantime, if the ring-shape step is 5 to 100 μm, the formation of the ion implanted area by implanting ions only into the main flat portion is facilitated.

Also, if the removal amount on the separated surface of the layer transferred wafer at polishing is set to not more than 1 μm, a processing time required for regeneration of the layer transferred wafer is further reduced, which lowers the regeneration cost and increases the number of regeneration times sufficiently. In addition, by using this regenerated wafer for the support wafer or the semiconductor wafer, it becomes possible to reuse the regenerated wafer two times or more, which the manufacturing costs of the SOI wafer can further reduce.

Moreover, in the regenerated wafer regenerated in the present invention, the separated surface of the layer transferred wafer in which the semiconductor wafer is separated from the thin layer on the whole surface of the ion implanted area is polished so that no step is generated in the periphery, and the regenerated wafer has a high flatness.

What is claimed is:

1. A process for regeneration of a layer transferred wafer, in which a main surface of a semiconductor wafer has a main flat portion and a chamfered portion formed on the periphery of said main flat portion, an ion implanted area is formed inside said semiconductor wafer by implanting ions only into said main surface of said semiconductor wafer, a laminated body is formed by laminating said main flat portion of said semiconductor wafer on a main surface of a support wafer, and said semiconductor wafer is separated from a thin layer in said ion implanted area by heat treatment of said laminated body so as to obtain a thick layer transferred wafer, wherein a ring-shape step is formed protruding from said chamfered portion in the main flat portion of said semiconductor wafer, and said semiconductor wafer is separated from the thin layer on the whole surface of said ion implanted area so that no step is generated in the periphery to obtain the layer transferred wafer.

2. The process for generation of a layer transferred wafer of claim 1, wherein the semiconductor wafer further has a ring-shape flat portion between the main flat portion and the chamfered portion, and a width w of the ring-shape flat portion 13f is 0.1 to 2 mm.

3. The process for generation of a layer transferred wafer of claim 2, wherein a bias amount (s) by which a center (p) on the end face connecting both chamfered portions formed, respectively, on both main surfaces of the semiconductor wafer to each other is biased from a center (C) in the thickness direction of the semiconductor wafer is not more than 50 μm.

4. The process of claim 1 wherein the ring-shape step is 5 to 100 μm.

5. The process of claim 2 wherein the ring-shape step is 5 to 100 μm.

6. The process of claim 3 wherein the ring-shape step is 5 to 100 μm.

7. The process of claim 1, which further comprises polishing the separated surface of the layer transferred wafer to obtain a regenerated wafer and the amount removed from the separated surface during polishing is not less than 0.2 μm but not more than 1.0 μm.

8. The process of claim 2, which further comprises polishing the separated surface of the layer transferred wafer to obtain a regenerated wafer and the amount removed from the separated surface during polishing is not less than 0.2 μm but not more than 1.0 μm.

9. The process of claim 3, which further comprises polishing the separated surface of the layer transferred wafer to obtain a regenerated wafer and the amount removed from the separated surface during polishing is not less than 0.2 μm but not more than 1.0 μm.

10. The process of claim 4, which further comprises polishing the separated surface of the layer transferred wafer to obtain a regenerated wafer and the amount removed from the separated surface during polishing is not less than 0.2 μm but not more than 1.0 μm.

11. The process of claim 7, wherein the regenerated wafer obtained by polishing the separated surface of the layer transferred wafer is subjected to a heat treatment at 900 to 1100° C. in an oxidized atmosphere.

12. The process of claim 8 wherein the regenerated wafer obtained by polishing the separated surface of the layer transferred wafer is subjected to a heat treatment at 900 to 1100° C. in an oxidized atmosphere.

13. The process of claim 9 wherein the regenerated wafer obtained by polishing the separated surface of the layer transferred wafer is subjected to a heat treatment at 900 to 1100° C. in an oxidized atmosphere.

14. The process of claim 10 wherein the regenerated wafer obtained by polishing the separated surface of the layer transferred wafer is subjected to a heat treatment at 900 to 1100° C. in an oxidized atmosphere.

15. The process of claim 1 wherein the regenerated wafer is used for the semiconductor wafer.

* * * * *